(12) United States Patent
Wan et al.

(10) Patent No.: US 7,764,215 B2
(45) Date of Patent: Jul. 27, 2010

(54) MULTI-STAGE COMPARATOR WITH OFFSET CANCELING CAPACITOR ACROSS SECONDARY DIFFERENTIAL INPUTS FOR HIGH-SPEED LOW-GAIN COMPARE AND HIGH-GAIN AUTO-ZEROING

(75) Inventors: Ho Ming Karen Wan, Hong Kong (HK); Yat To William Wong, Hong Kong (HK); Kwai Chi Chan, Hong Kong (HK); Kwok Kuen David Kwong, Davis, CA (US)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 46 days.

(21) Appl. No.: 12/347,113

(22) Filed: Dec. 31, 2008

(65) Prior Publication Data

US 2010/0164770 A1  Jul. 1, 2010

(51) Int. Cl.
*H03M 1/34* (2006.01)
(52) U.S. Cl. .................. 341/163; 341/155; 341/161
(58) Field of Classification Search .............. 341/161, 341/163
See application file for complete search history.

(56) References Cited

U.S. PATENT DOCUMENTS 5,600,275 A    2/1997  Garavan
6,429,697 B1   8/2002  Amazeen et al.
7,336,214 B2*  2/2008  Krymski .................. 341/172
7,551,116 B2*  6/2009  Tomisawa et al. .......... 341/165

OTHER PUBLICATIONS

Ohara et al., A CMOS Programmable Self-Calibrating 13-bit Eight-Channel Data Acquisition Peripheral, IEEE Journal of Solid-State Circuits, vol. SC-22 No. 6, Dec. 1987, pp. 930-938.
Dzahani & Ghazlane, Auto-zero stabilized CMOS amplifiers for very low voltage or current offset, 2004 IEEE 0-7803-8257-9/04, 2004, pp. 6-10.

* cited by examiner

*Primary Examiner*—Khai M Nguyen
(74) *Attorney, Agent, or Firm*—Stuart T. Auvinen; gPatent LLC

(57) ABSTRACT

An Analog-to-Digital Converter (ADC) has a Successive-Approximation-Register (SAR) driving a digital-to-analog converter (DAC) that generates an analog voltage compared to an input voltage by a series of stages. The last stage feeds a compare signal to the SAR. Each stage has a dual-input differential amplifier that operates as a unity gain op amp during an auto-zeroing phase and as a high-speed low-gain amplifier during an amplifying phase. The dual-input differential amplifier has two pairs of differential inputs. A secondary pair has an offset-storing capacitor across it, and connects to the output pair through feedback switches during auto-zeroing. A primary pair connects to stage inputs through input switches during the amplifying phase. Since two pairs of differential inputs are provided to the dual-input differential amplifier, the offset capacitor is completely isolated from the input pair. The current sink in the dual-input differential amplifier is adjusted higher during the amplifying period.

23 Claims, 7 Drawing Sheets

MULTI-STAGE COMPARATOR WITH OFFSET CANCELING CAPACITOR ACROSS SECONDARY DIFFERENTIAL INPUTS FOR HIGH-SPEED LOW-GAIN COMPARE AND HIGH-GAIN AUTO-ZEROING

FIELD OF THE INVENTION

This invention relates to Analog-to-Digital Converters (ADC), and more particularly to a dual-use comparator for a multi-stage ADC.

BACKGROUND OF THE INVENTION

Many types of Analog-to-Digital Converters (ADC's) have been used for a wide variety of applications. Flash ADC's compare analog signal voltages to multiple voltage levels in an instant to produce a multi-bit digital word that represents the analog voltage. Successive-approximation ADC's use a series of stages to convert an analog voltage to digital bits. Each stage compares an analog voltage to a reference voltage, producing one digital bit. In sub-ranging ADC's, each stage compares an analog voltage to several voltage levels, so that each stage produces several bits. Succeeding stages generate lower-significant digital bits than do earlier stages in the pipeline.

Algorithmic, re-circulating, or recycling ADC's use a loop to convert an analog voltage. The analog voltage is sampled and compared to produce a most-significant digital bit. Then the digital bit is converted back to analog and subtracted from the analog voltage to produce a residue voltage. The residue voltage is then multiplied by two and looped back to the comparator to generate the next digital bit. Thus the digital bits are generated over multiple cycles in the same comparator stage.

FIG. 1 shows a Successive-Approximation-Register ADC. Successive-Approximation-Register SAR 302 receives a clock CLK and contains a register value that is changed to gradually zero-in on a close approximation of the analog input voltage VIN. For example, the value in SAR 302 may first be 0.5, then 0.25, then 0.32, then 0.28, then 0.30, then 0.31, then 0.315, then 0.313, then 0.312, when comparing to a VIN of 0.312 volts. SAR 302 outputs the current register value to digital-to-analog converter (DAC) 300, which receives a reference voltage VREF and converts the register value to an analog voltage VA.

The input analog voltage VIN is applied to sample-and-hold circuit 304, which samples and holds the value of VIN. For example, a capacitor can be charged by VIN and then the capacitor isolated from VIN to hold the analog voltage. The sampled input voltage from sample-and-hold circuit 304 is applied to the inverting input of comparator 306. The converted analog voltage VA is applied to the non-inverting input of comparator 306.

Comparator 306 compares the converted analog voltage VA to the sampled input voltage and generates a high output when the converted analog voltage VA is above the sampled VIN, and the register value in SAR 302 is too high. The register value in SAR 302 can then be reduced.

When the converted analog voltage VA is below the sampled input voltage, comparator 306 generates a low output to SAR 302. The register value in SAR 302 is too low. The register value in SAR 302 can then be increased for the next cycle.

The register value from SAR 302 is a binary value of N bits, with D(N−1) being the most-significant-bit (MSB) and D0 being the least-significant-bit (LSB). SAR 302 can first set the MSB D(N−1), then compare the converted analog voltage VA to the input voltage VIN, then adjust the MSB and/or set the next MSB D(N−2) based on the comparison. The set and compare cycle repeats until after N cycles the LSB is set. After the last cycle, the end-of-cycle EOC signal is activated to signal completion. A state machine or other controller can be used with or included inside SAR 302 to control sequencing.

Comparator 306 can be replaced with a series of pre-amplifier stages and a final latch. FIG. 2A is a response graph of pre-amplifier and latch stages. The pre-amplifier stages have a negative response shown by curve 312, while the final latch has a positive response as shown by curve 310. For low voltages, curve 312 is above and to the left curve 310, indicating that the pre-amplifiers require less time to achieve the same VOUT voltage than the latch. However, for higher VOUT voltages, curve 310 is above curve 312, indicating that for larger values of VOUT, the latch can achieve these larger voltage outputs much faster than the pre-amplifiers.

FIG. 2B shows a series of pre-amplifiers and a final latch. Pre-amplifier stages 320, 322, 324, 326, 328 are amplifiers that boost the voltage difference between VIN and VA. Especially near the end of comparison when the LSB is being set, the difference between VIN and VA can be quite small. This voltage difference is gradually increased by the pre-amplifier stages until the final stage. Latch stage 330 latches this voltage difference to generate the compare signal that is fed back to SAR 302. Thus stages 320-330 replace comparator 306 of FIG. 1.

By combining a series of pre-amplifier stages with the positive response of the final latch, a fast response time can be achieved. The pre-amplifier stages can gradually amplify and enlarge the voltage difference between VIN and VA until the amplified voltage difference is large enough to drive the final latch. The delay time can be minimized by using low-gain, wide bandwidth pre-amplifiers.

FIG. 3 shows a prior-art auto-zeroing amplifier stage for an ADC. Small mis-matches or other offset voltages in a comparator circuit can be larger than the voltage difference being compared. These offsets can be stored in the comparator during an auto-zeroing period and then cancelled during an amplifying period.

During the zeroing period, clock φ1 is active, closing switches 338, 346, 348, but φ2 is inactive, leaving switches 342, 344 open. The input voltages VIN+, VIN− are disconnected. Switch 346 equalizes the two inputs that receive VIN+, VIN− to the same voltage. Switch 338 connects the output of op amp 336 to its inverting input, providing a unity gain configuration. Offset voltage VOS 350 is a parasitic offset voltage rather than a voltage source such as a battery. When switch 338 is closed, and op amp 336 is in the unity gain configuration, VOS applied to the input of op amp 336 is driven to the output VOUT. Switch 348 also closes during φ1, driving the other end of VOS 350 to ground. Capacitor 340 isolates the negative terminal of VOS from the inputs. VOS is fed back from VOUT through switches 338, 348 to the other plate of capacitor 340, so VOS is effectively stored on capacitor 340 during the zeroing period.

During the amplifying period, φ1 is inactive and φ2 is active. Switches 338, 346, 348 open while switches 342, 344 close to connect VIN+, VIN− to the inputs of op amp 336. Capacitor 340 stored negative VOS during the zeroing period, so the VOS on capacitor 340 cancels VOS 350. The offset is canceled. VIN+ minus VOS plus VOS, or just VIN+, is applied to the non-inverting input of op amp 336. VIN− is applied to the inverting input of op amp 336, so op amp 336 amplifies the voltage difference VIN+, VIN− to generate VOUT.

A series of such stages can be cascaded together in a prior-art ADC. Offsets can be stored in each stage, and a final latch stage can stored the final amplified result. VIN+ to the first stage can be VA and VIN− can be VIN of FIG. 1.

Auto-zeroing requires a high-gain amplifier, yet a low-gain pre-amplifier was needed for high speed, such as shown in FIG. 2. This contradiction between high-gain and low-gain requirements makes design of such ADC's problematic. ADC's may have the desired gain, but may operate slowly or with fewer bits of precision. Tradeoffs may reduce the performance, either of speed or of precision, of the resulting ADC.

In critical comparisons, such as with many digital bits of precision, the voltage applied to the comparator is small enough such that all the outputs may end up in the linear input range; thus the time taken for each output to reach the linear input region is much greater. The overdrive recovery delay is roughly four times the delay of any one amplifier. The overdrive recovery delay is the time from when the input is first applied to the first preamplifier stage to the time when the output of the last preamplifier returns from saturation to linear operation. This increased overdrive recovery delay is undesirable. Extra amplifiers may be used to compensate, but these extra amplifiers increase cost and are also undesirable.

What is desired is a comparator stage for an ADC that can operate as both a low-gain preamplifier and a high-gain op amp. A stage that can provide unity-gain negative-feedback offset cancellation and low-gain pre-amplification is desired. A dual-use stage in an ADC is desirable.

DETAILED DESCRIPTION

The present invention relates to an improvement in comparators for ADC's. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
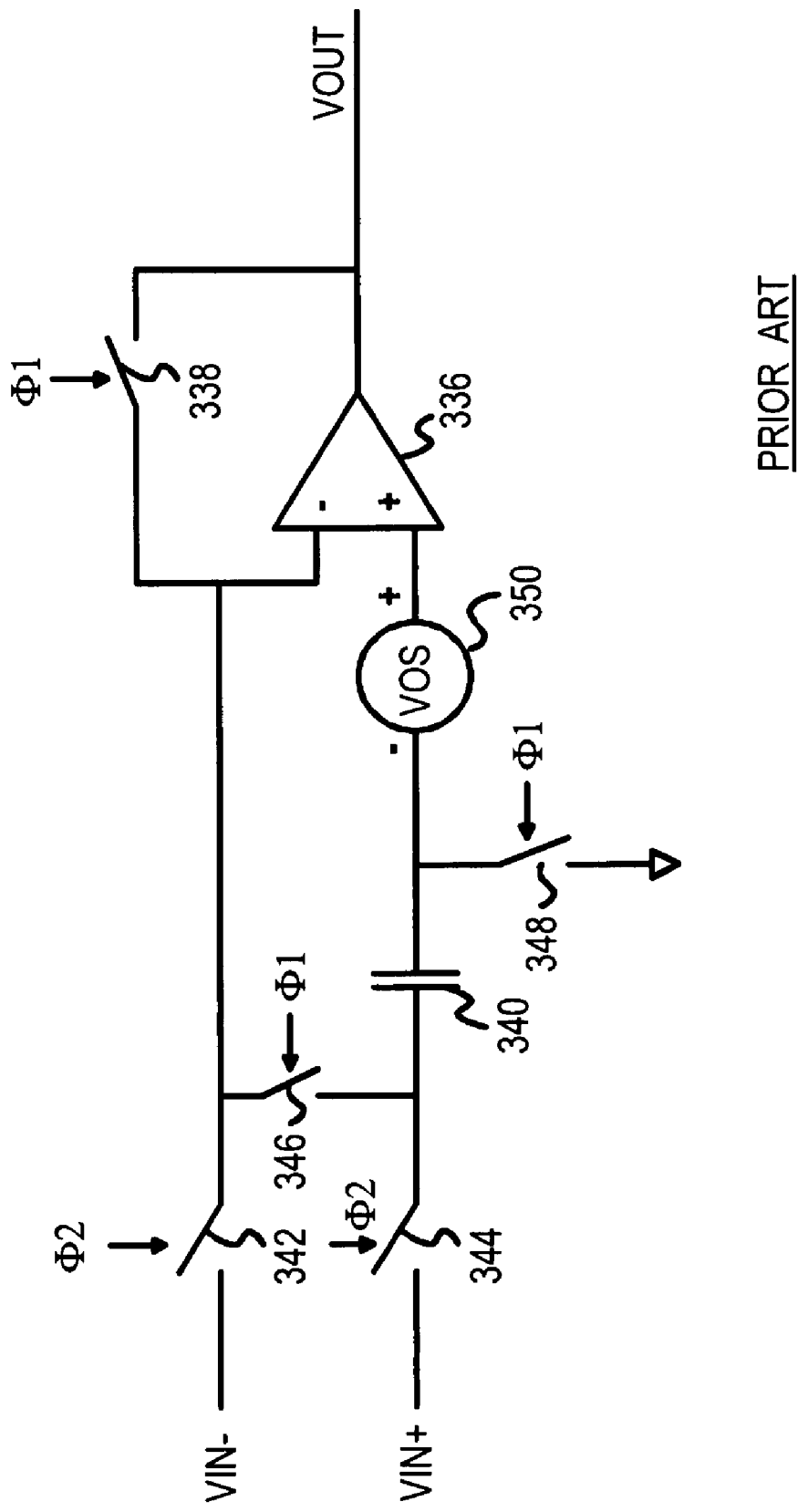
FIG. 3 shows a prior-art auto-zeroing amplifier stage for an ADC.
Figure 4:
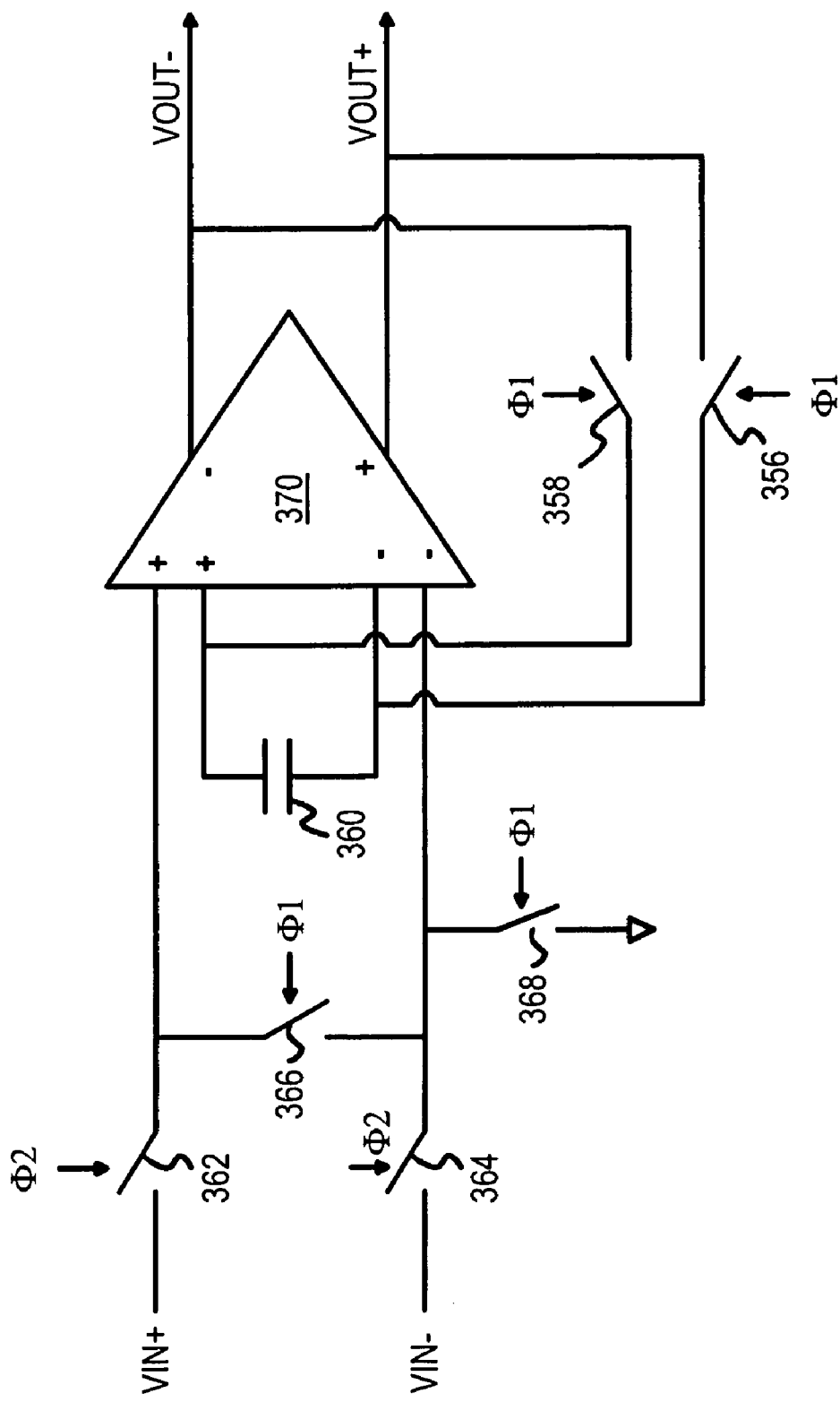
FIG. 4 is a diagram of a dual-input differential amplifier comparator stage in an ADC.

FIG. 4 is a diagram of a comparator stage in an ADC. While the prior art of FIG. 3 places the capacitor in series between input VIN+ and the op amp, the inventors provide a direct path to the input of an op amp, and place capacitor 360 across a second pair of inputs to dual-input differential amplifier 370.

While a standard op amp has one pair of differential inputs, dual-input differential amplifier 370 has two pairs of differential inputs. Input voltage VIN+ passes through switch 362 to the primary non-inverting (+) input to dual-input differential amplifier 370, while input voltage VIN− passes through switch 364 to the primary inverting (−) input to dual-input differential amplifier 370. Switches 362, 364 close during phase φ2 to connect inputs VIN+, VIN− to dual-input differential amplifier 370, but are open during φ2, when switch 366 closes to equalize the primary differential inputs to dual-input differential amplifier 370, and switch 368 closes to ground these primary inputs.

Offset capacitor 360 is coupled across the secondary differential inputs to dual-input differential amplifier 370. Feedback switches 356, 358 close during φ1 to connect stage outputs VOUT+, VOUT− to the terminals of offset capacitor 360 and to the secondary inputs of dual-input differential amplifier 370. Any offsets in the stage are fed back and stored on offset capacitor 360 during φ1.

In an ADC, there may be several stages such as that shown in FIG. 4 that are cascaded together. Each stage's VIN+, VIN− can be driven by VOUT+, VOUT− from the prior stage. The first stage can have VIN+ connected to the ADC input analog voltage, while VIN− is connected to VA from DAC 300 of FIG. 1. The last stage can drive a latch that drives a compare signal back to SAR 302.

During the auto-zeroing phase, φ1 is active and φ2 is inactive. Input switches 362, 364 are open, isolating dual-input differential amplifier 370 from stage inputs VIN+, VIN−. Switches 366, 368 close, grounding both primary differential inputs to dual-input differential amplifier 370. Feedback switches 356, 358 close, connecting stage outputs VOUT+, VOUT− to the secondary differential inputs of dual-input differential amplifier 370. Thus dual-input differential amplifier 370 is connected in a unity-gain configuration of the secondary inputs, while the primary inputs are grounded. Dual-input differential amplifier 370 operates as a high gain op amp. Any offsets in the stage are fed back through feedback switches 356, 358 and stored on offset capacitor 360.

During the amplifying phase, φ1 is inactive but φ2 is active. Input switches 362, 364 are closed, connecting from stage inputs VIN+, VIN− to the primary differential inputs of dual-input differential amplifier 370. Switches 366, 368 are open, and feedback switches 356, 358 are open. The differential signal on VIN+, VIN− is amplified to generate VOUT+, VOUT−.

Dual-input differential amplifier 370 operates as a high-speed, low-gain amplifier during amplifying phase φ2, but operates as a unity-gain op amp during auto-zeroing phase φ1.

Figure 5:
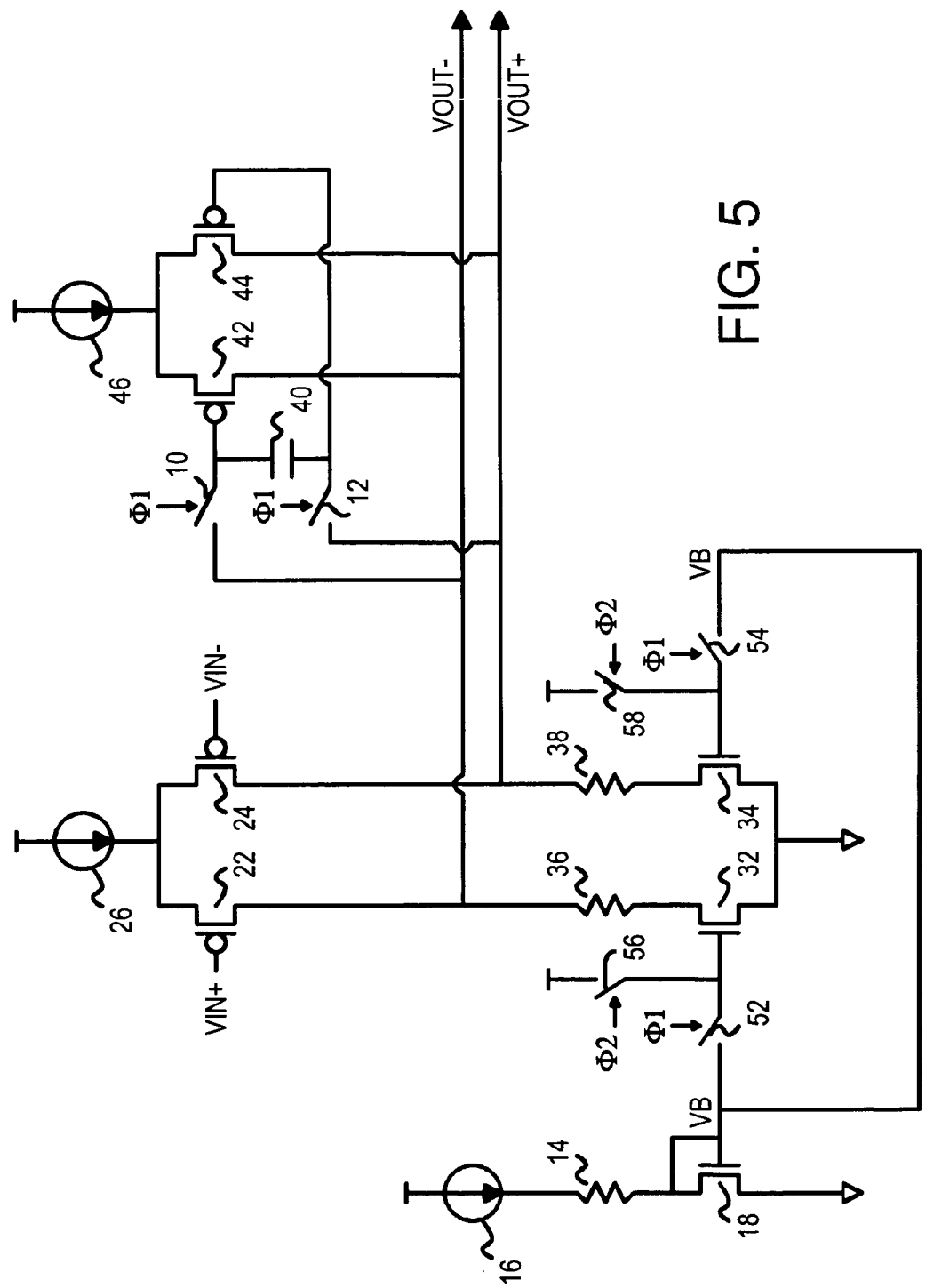
FIG. 5 is a schematic of a comparing and auto-zeroing stage in an ADC.

FIG. 5 is a schematic of a comparing and auto-zeroing stage in an ADC. The schematic of FIG. 5 is functionally equivalent to FIG. 4, with some differences. For example, stage inputs VIN+, VIN− are applied directly to the gates of p-channel primary differential transistors 22, 24 rather than through input switches 362, 364. P-channel primary differential transistors 22, 24 switch current to VOUT+, VOUT− from current source 26 during amplifying phase φ2. Thus VIN+, VIN− are quickly amplified during φ2.

Feedback from the VOUT+, VOUT− outputs pass through feedback switches 10, 12 during φ1 to the gates of p-channel secondary differential transistors 42, 44, which switch current from current source 46 during auto-zeroing phase φ1. Closing feedback switches 10, 12 causes the dual-input differential amplifier to operate as a unity gain amplifier.

In the unity gain configuration, any offsets are fed back through feedback switches 10, 12 and stored on offset capacitor 40 which has its terminals connected to the gates of p-channel secondary differential transistors 42, 44.

The currents through p-channel primary differential transistors 22, 24 and p-channel secondary differential transistors 42, 44 are sunk through resistors 36, 38 and n-channel sink transistors 32, 34, which are connected between VOUT+, VOUT− and ground. The gates of n-channel sink transistors 32, 34 are driven with an adjustable bias voltage.

During auto-zeroing phase φ1, switches 52, 54 close and switches 56, 58 are open. A bias voltage VB is generated by current source 16 providing a current through resistor 14 and n-channel bias transistor 18, which has its gate and drain connected together as bias voltage VB. The bias voltage applied to the gates of n-channel sink transistors 32, 34 causes them to operate in the linear region to provide a high gain, but low current and thus a lower speed of operation. With feedback switches 10, 12 closed, the dual-input differential amplifier operates as a unity-gain op amp during auto-zeroing phase φ1.

During amplifying phase φ2 switches 52, 54 are open but switches 56, 58 close. Switches 56, 58 drive the power-supply voltage VDD to the gates of n-channel sink transistors 32, 34, Applying VDD to the gates of n-channel sink transistors 32, 34 provides the maximum current drive. The high current provides a faster speed of operation, although the gain is low. Thus the dual-input differential amplifier operates as a high-speed, low-gain amplifier during amplifying phase φ2.

Resistors 36, 38 provide a voltage drop as the sink current flows through them to n-channel sink transistors 32, 34. This voltage drop increases the voltage levels of VOUT+, VOUT− and can provide a well-defined gain. In some embodiments, resistors 36, 38 may be deleted, or may be parasitic drain resistances.

Figure 6:
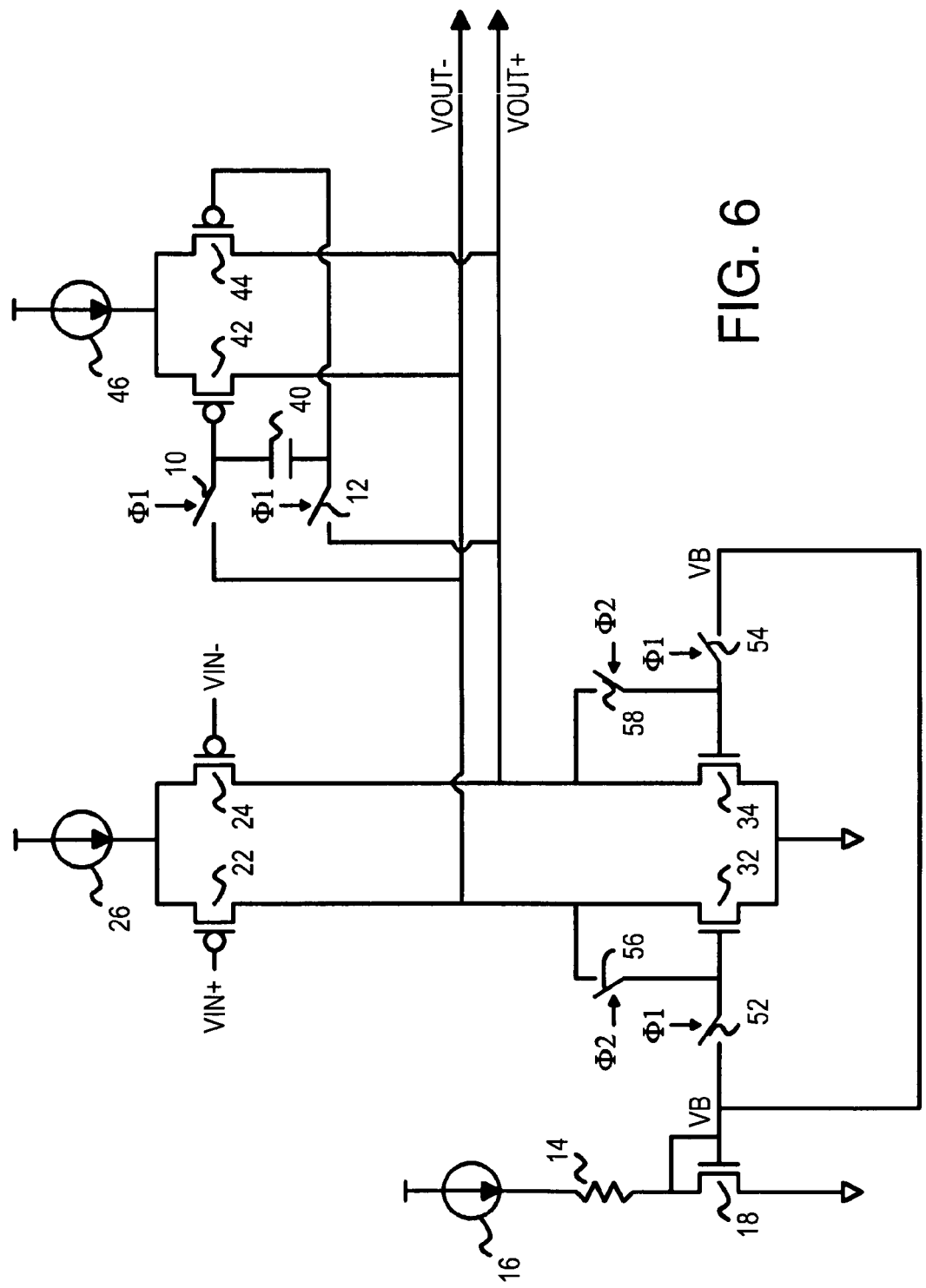
FIG. 6 is a schematic of an alternate embodiment of a comparing and auto-zeroing stage in an ADC.

FIG. 6 is a schematic of an alternate embodiment of a comparing and auto-zeroing stage in an ADC. The schematic of FIG. 6 is functionally equivalent to FIG. 4, with some differences. For example, stage inputs VIN+, VIN− are applied directly to the gates of p-channel primary differential transistors 22, 24 rather than through input switches 362, 364. P-channel primary differential transistors 22, 24 switch current to VOUT+, VOUT− from current source 26 during amplifying phase φ2. Thus VIN+, VIN− are quickly amplified during φ2.

Feedback from the VOUT+, VOUT− outputs pass through feedback switches 10, 12 during φ1 to the gates of p-channel secondary differential transistors 42, 44, which switch current from current source 46 during auto-zeroing phase φ1. Closing feedback switches 10, 12 causes the dual-input differential amplifier to operate as a unity gain amplifier.

In the unity gain configuration, any offsets are fed back through feedback switches 10, 12 and stored on offset capacitor 40 which has its terminals connected to the gates of p-channel secondary differential transistors 42, 44.

The currents through p-channel primary differential transistors 22, 24 and p-channel secondary differential transistors 42, 44 are sunk through n-channel sink transistors 32, 34, which are connected between VOUT+, VOUT− and ground. The gates of n-channel sink transistors 32, 34 are driven with an adjustable bias voltage.

During auto-zeroing phase φ1, switches 52, 54 close and switches 56, 58 are open. A bias voltage VB is generated by current source 16 providing a current through resistor 14 and n-channel bias transistor 18, which has its gate and drain connected together as bias voltage VB. The bias voltage applied to the gates of n-channel sink transistors 32, 34 causes them to operate in the linear region to provide a high gain, but low current and thus a lower speed of operation. With feedback switches 10, 12 closed, the dual-input differential amplifier operates as a unity-gain op amp during auto-zeroing phase φ1.

During amplifying phase φ2 switches 52, 54 are open but switches 56, 58 close. The gates and drains of p-channel primary differential transistors 22, 24 are shorted together by switches 56, 58, causing n-channel sink transistors 32, 34 to operate as a resistor with a resistance of 1/gm. The high current provides a faster speed of operation, although the gain is low. Thus the dual-input differential amplifier operates as a high-speed, low-gain amplifier during amplifying phase φ2.

Figure 1:
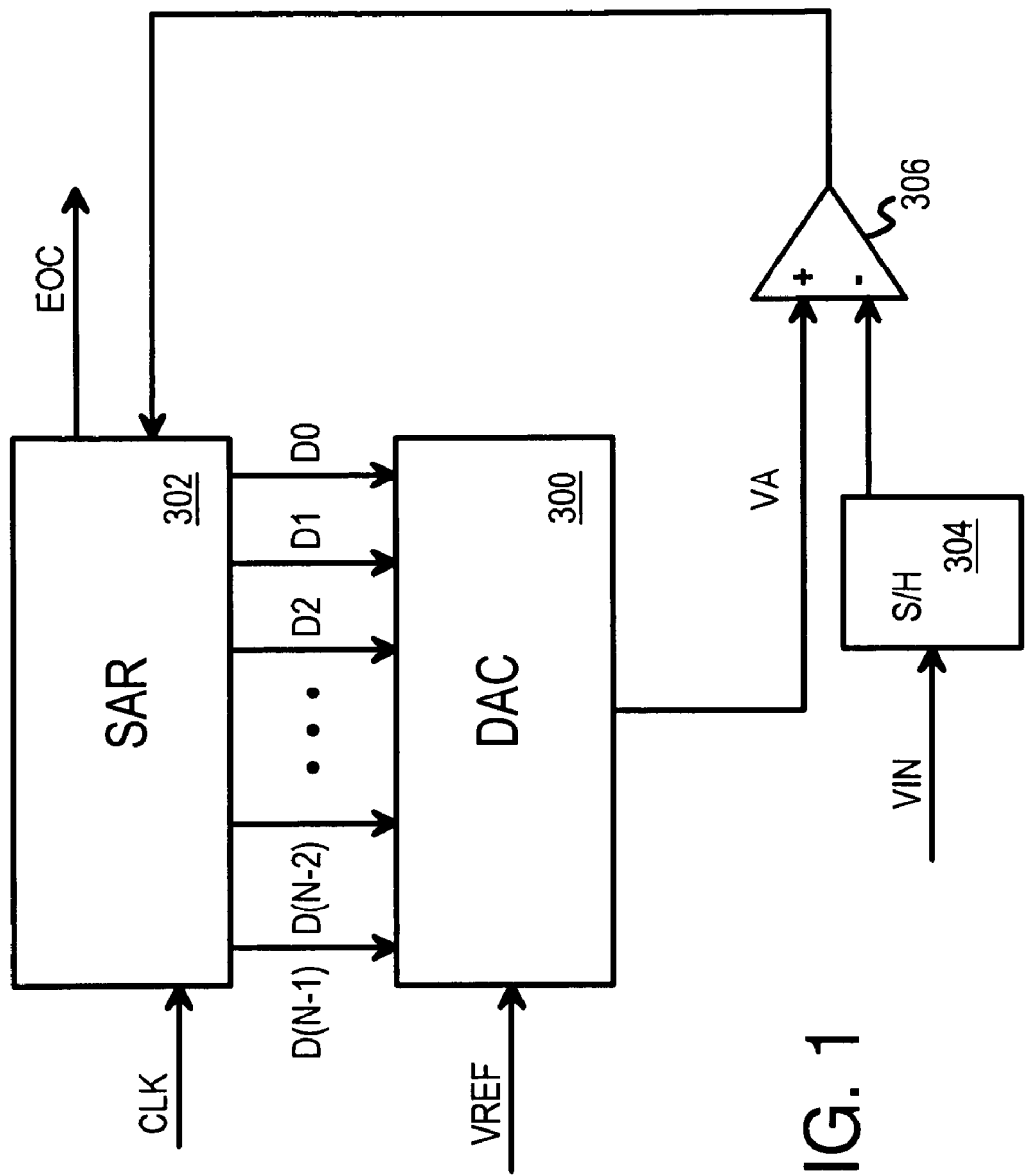
FIG. 1 shows a Successive-Approximation-Register ADC.
Figure 2A:
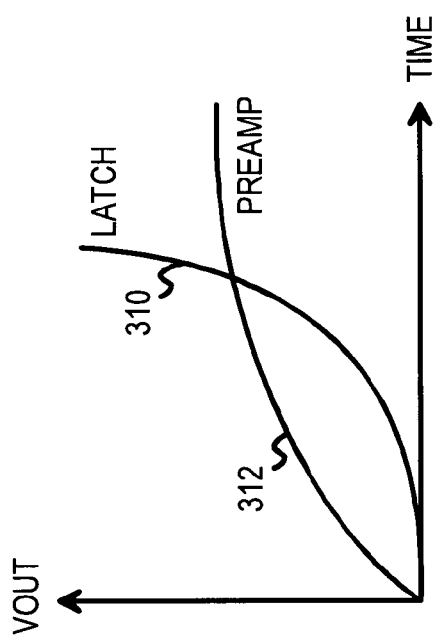
FIG. 2A is a response graph of pre-amplifier and latch stages.
Figure 2B:
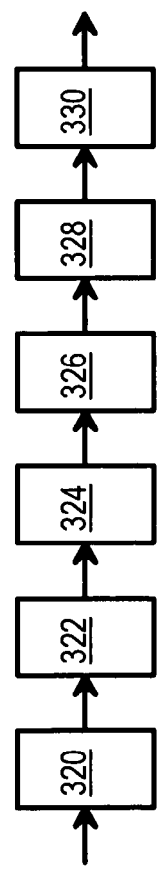
FIG. 2B shows a series of pre-amplifiers and a final latch.
Figure 7:
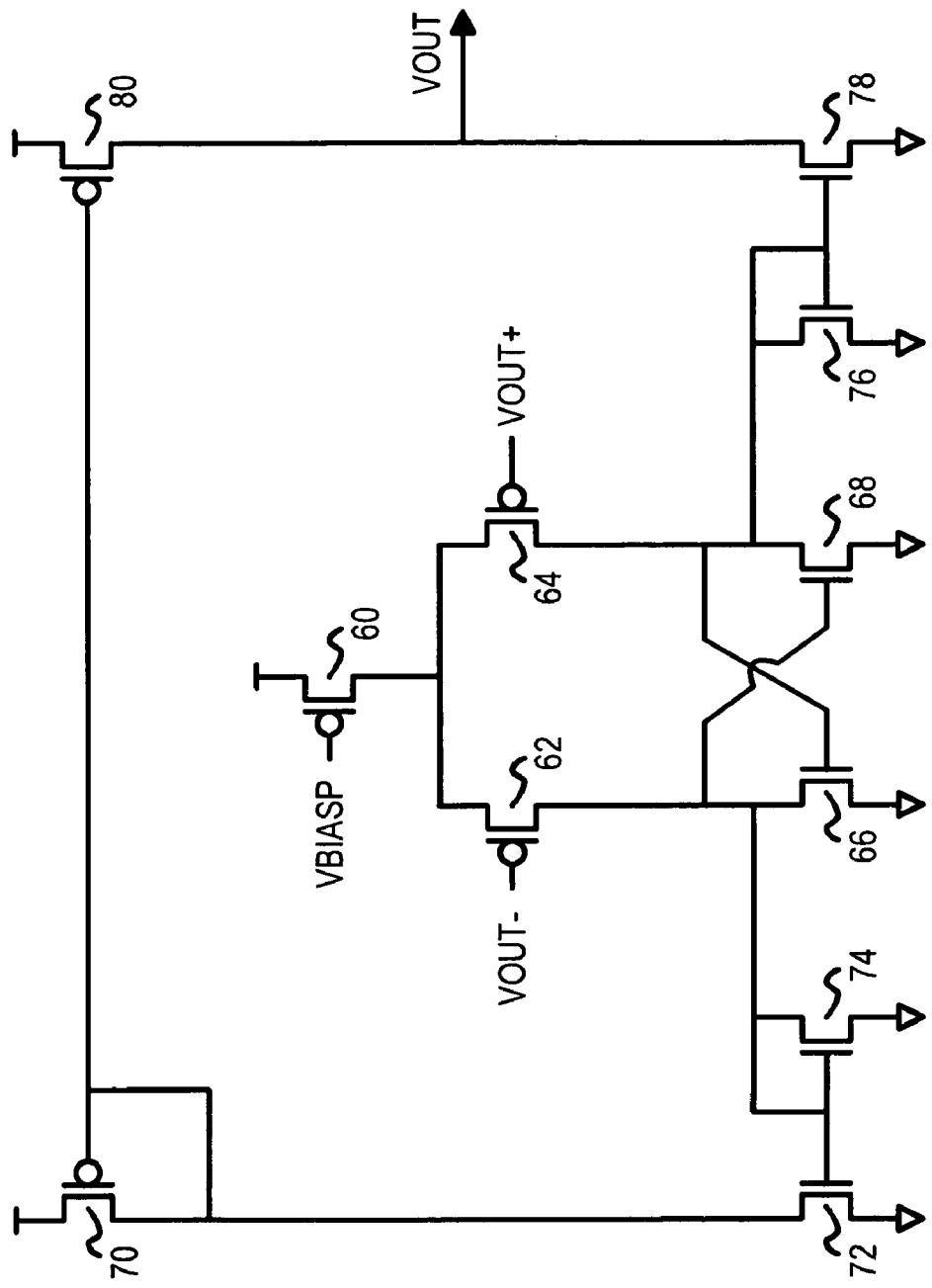
FIG. 7 is a schematic of a final latch.

FIG. 7 is a schematic of a final latch. An ADC may have several stages, such as 8 stages of FIG. 6 cascaded together, with a final latch stage that drives the compare output back to SAR 302 of FIG. 1. Rather than sample and hold the input analog voltage, as shown in FIG. 1, the result of comparing the input analog voltage to the DAC voltage VA is stored in the final latch.

In the final latch, the output from the last stage, VOUT+, VOUT−, is applied to the gates of p-channel differential latch transistors 64, 62, which switch current sourced by p-channel current source transistor 60 which receives a bias voltage VBIASP on its gate. The current switched by p-channel differential latch transistors 62, 64 toggles the bistable sink, which has n-channel latch transistors 66, 68 with their gates cross-coupled to their drain.

The latched value on n-channel latch transistors 66, 68 is output from their drains. The drain of n-channel latch transistor 66 and the gate of n-channel latch transistor 68 is applied to the gates of n-channel transistors 72, 74, and to the drain of n-channel transistor 74. Transistors 70, 72 have their drains connected together, and the gate and drain of p-channel transistor 70 are connected together and to the gate of p-channel transistor 80 to source output current to the latched output VOUT, which can be the compare output that is fed back to SAR 302 of FIG. 1.

The drain of n-channel latch transistor 68 and the gate of n-channel latch transistor 66 are applied to the gates of n-channel transistors 76, 78, and to the drain of n-channel transistor 76. Transistors 80, 78 have their drains connected together as the latched compare output VOUT.

During auto-zeroing phase φ1, VOUT+, VOUT− from the last stage are driven to a mid-point voltage by the unity gain configuration. Since VOUT+, VOUT− are driven to the same voltage during auto-zeroing, the latch is ready to be tipped to one state or the other during amplifying period φ2.

Simulations for a 0.35 um process show that an 8-stage comparator can convert an input of +/−30 uV in 230 ns when there is no offset. When an offset of 2 mV is added to each stage, the 8-stage comparator can convert an input of +/−30 uV with a delay of 280 ns.

Alternate Embodiments

Several other embodiments are contemplated by the inventors. For example a bipolar junction transistor (BJT) or diode may replace transistors 32, 34. The number of bits in the register value in SAR 302 can be adjusted to achieve the desired accuracy. For example, when N is 16 bits and VREF is 2 volts, the LSB represents 30 micro-volts, which is the precision of the ADC. A different number of bits could be substituted for a different precision, and the number of bits could be fixed or could be variable.

Rather than use p-channel differential transistors, the circuit can be inverted or reversed and n-channel differential transistors substituted, and other p-channel transistors swapped to n-channel transistors, supply rails reversed, etc.

Inversions may be added by swapping inverting and non-inverting inputs as desired, but do not change the overall function and thus may be considered equivalents.

The resistance values of select and other resistors may vary in different patterns. Capacitors and other filter elements may be added. Switches could be n-channel transistors, p-channel transistors, or transmission gates with parallel n-channel and p-channel transistors.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes.

While comparison to a single analog voltage has been described, a differential analog voltage could also be compared. The differential input voltage could be latched and then the latched single-ended voltage compared to the DAC voltage. Differential analog voltages could also be compared using a differential amplifier with a defined gain at the input. While an operational amplifier (op amp) has been described, other kinds of comparators could be used, such as non-amplifying compare buffers.

While positive currents have been described, currents may be negative or positive, as electrons or holes may be considered the carrier in some cases. Source and sink currents may be interchangeable terms when referring to carriers of opposite polarity. Currents may flow in the reverse direction.

Rather than have equalizing switch 366, two grounding switches (FIG. 4 368 and a second grounding switch on the +input to 370) could be used on the true and complement inputs lines of the primary pair of inputs to dual-input differential amplifier 370. Rather than grounding, the switches could connect to another fixed voltage, such as VDD or VDD/2.

Current sources 26, 46 may be p-channel transistors with gates connected to a fixed bias voltage. The fixed bias voltage may be switched to VDD to power down the dual-input differential amplifier.

The circuit designer may choose resistors, capacitors, transistors, and other components to have a ratio that produces the desired reference voltages. While Complementary-Metal-Oxide-Semiconductor (CMOS) transistors have been described, other transistor technologies and variations may be substituted, and materials other than silicon may be used, such as Galium-Arsenide (GaAs) and other variations.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An Analog-to-Digital Converter (ADC) comprising:

an analog input having an analog input voltage;

a Successive-Approximation-Register (SAR) having a digital value that is successively adjusted to converge to closer approximations of the analog input voltage;

a digital-to-analog converter (DAC), receiving a reference voltage and the digital value from the SAR, for generating a converted analog voltage represented by the digital value;

a series of stages including a first stage and a final stage, the first stage receiving the converted analog voltage and the analog input voltage as stage inputs, the final stage outputting compare results as stage outputs, wherein each intermediate stage in the series of stages has stage inputs coupled to stage outputs of a prior stage and stage outputs connected to stage inputs of a following stage;

a final latch, coupled to receive the compare results from the final stage, for latching the compare results for transmission to the SAR, wherein the SAR adjusts the digital value based on the compare results from the final latch;

wherein each stage in the series of stages comprises:

a dual-input differential amplifier having a first pair of differential inputs and a second pair of differential inputs and a pair of differential outputs, wherein a first voltage difference between the first pair of differential inputs is amplified and a second voltage difference between the second pair of differential inputs is amplified and combined to generate the pair of differential outputs;

wherein the pair of differential outputs are the stage outputs;

an offset-storing capacitor coupled between the second pair of differential inputs;

a pair of feedback switches coupled between the pair of differential outputs and the second pair of differential inputs and closed during an auto-zeroing phase; and a pair of inputs switches coupled between the stage inputs and the first pair of differential inputs and closed during an amplifying phase, whereby offsets are stored on the offset-storing capacitor that is isolated from the stage inputs by using the dual-input differential amplifier with two pairs of differential inputs.

2. The ADC of claim 1 wherein each stage in the series of stages further comprises:
an equalizing switch coupled between the first pair of differential inputs to the dual-input differential amplifier, and closed during the auto-zeroing phase.

3. The ADC of claim 2 wherein each stage in the series of stages further comprises:
a grounding switch coupled between an inverting input of the first pair of differential inputs to the dual-input differential amplifier, and closed during the auto-zeroing phase.

4. The ADC of claim 1 further comprising:
an adjustable current in the dual-input differential amplifier, wherein the adjustable current is adjusted to a higher current during the amplifying phase and is adjusted to a lower current during the auto-zeroing phase,
whereby current in the dual-input differential amplifier is adjusted during phases.

5. The ADC of claim 4 wherein the dual-input differential amplifier further comprises:
a first current source;
a non-inverting first differential transistor, having a gate connected to a first non-inverting input in the first pair of differential inputs, and a drain connected to an inverting output in the pair of differential outputs, and a source connected to the first current source;
an inverting first differential transistor, having a gate connected to a first inverting input in the first pair of differential inputs, and a drain connected to a non-inverting output in the pair of differential outputs, and a source connected to the first current source;
a second current source;
a non-inverting second differential transistor, having a gate connected through a first one of the pair of feedback switches to the non-inverting output in the pair of differential outputs, and a drain connected to the non-inverting output in the pair of differential outputs, and a source connected to the second current source; and
an inverting second differential transistor, having a gate connected through a second one of the pair of feedback switches to the inverting output in the pair of differential outputs, and a drain connected to the inverting output in the pair of differential outputs, and a source connected to the second current source.

6. The ADC of claim 5 wherein the dual-input differential amplifier further comprises:
an inverting current sink transistor having a drain connected to the inverting output in the pair of differential outputs and a source connected to a ground and a gate connected to a first sink gate node;
a non-inverting current sink transistor having a drain connected to the non-inverting output in the pair of differential outputs and a source connected to the ground and a gate connected to a second sink gate node;
a first bias switch for applying a bias voltage to the first sink gate node during the auto-zeroing phase; and
a second bias switch for applying the bias voltage to the second sink gate node during the auto-zeroing phase.

7. The ADC of claim 6 wherein the dual-input differential amplifier further comprises:
a first shorting switch for connecting the first sink gate node to the inverting output during the amplifying phase;
a second shorting switch for connecting the second sink gate node to the non-inverting output during the amplifying phase.

8. The ADC of claim 6 wherein the dual-input differential amplifier further comprises:
a first amplifying-bias switch for connecting the first sink gate node to an amplifying bias voltage during the amplifying phase;
a second amplifying-bias switch for connecting the second sink gate node to the amplifying bias voltage during the amplifying phase.

9. The ADC of claim 8 wherein the amplifying bias voltage is a power-supply voltage.

10. The ADC of claim 8 wherein the dual-input differential amplifier further comprises:
a first resistor coupled between the drain of the inverting current sink transistor and the inverting output in the pair of differential outputs;
a second resistor coupled between the drain of the non-inverting current sink transistor and the non-inverting output in the pair of differential outputs.

11. The ADC of claim 6 wherein the non-inverting first differential transistor, the inverting first differential transistor, the non-inverting second differential transistor, and the inverting second differential transistor are p-channel transistors.

12. The ADC of claim 11 wherein the non-inverting current sink transistor and the inverting current sink transistor are n-channel transistors.

13. A dual-input differential amplifier comprising:
first current source means for generating a first current;
first primary differential transistor means, having a gate receiving a non-inverting input, for conducting a portion of the first current to an inverting output;
second primary differential transistor means, having a gate receiving an inverting input, for conducting a portion of the first current to a non-inverting output;
second current source means for generating a second current;
first secondary differential transistor means, having a gate receiving a non-inverting feedback input, for conducting a portion of the second current to the inverting output;
second secondary differential transistor means, having a gate receiving an inverting feedback input, for conducting a portion of the second current to the non-inverting output;
inverting current sink transistor means for conducting a first sink current from the inverting output in response to a first sink gate; and
non-inverting current sink transistor means for conducting a second sink current from the non-inverting output in response to a second sink gate.

14. The dual-input differential amplifier of claim 13 further comprising:
first feedback switch means for connecting the non-inverting feedback input to the non-inverting output in response to a first clock;
second feedback switch means for connecting the inverting feedback input to the inverting output in response to the first clock;
capacitor means for storing an offset charge between the inverting feedback input and the non-inverting feedback input.

15. The dual-input differential amplifier of claim 14 wherein the first primary differential transistor means, the second primary differential transistor means, the first secondary differential transistor means, and the second secondary differential transistor means comprise p-channel transistors;
wherein the inverting current sink transistor means and the non-inverting current sink transistor means comprise n-channel transistors.

16. The dual-input differential amplifier of claim 15 further comprising:
first variable bias means for applying a first bias voltage to the first sink gate when a first clock is active, and for applying a second bias voltage to the first sink gate when a second clock is active;
second variable bias means for applying a first bias voltage to the second sink gate when the first clock is active, and for applying a second bias voltage to the second sink gate when the second clock is active.

17. The dual-input differential amplifier of claim 16 further comprising:
first resistor means, in series between the inverting current sink transistor means and the inverting output, for conducting the first sink current to improve gain;
second resistor means, in series between the non-inverting current sink transistor means and the non-inverting output, for conducting the second sink current to improve gain.

18. The dual-input differential amplifier of claim 17 further comprising:
first power switch means for applying a power-supply voltage to the first sink gate in response to the second clock;
second power switch means for applying a power-supply voltage to the second sink gate in response to the second clock.

19. The dual-input differential amplifier of claim 16 further comprising:
wherein the first variable bias means comprises:
first bias switch means for applying the first bias voltage to the first sink gate in response to the first clock;
second bias switch means for applying the second bias voltage to the second sink gate in response to the second clock;
first shorting switch means for shorting the inverting output to the first sink gate in response to the second clock; and
second shorting switch means for shorting the inverting output to the second sink gate in response to the second clock.

20. A Successive-Approximation-Register Analog-to-Digital Converter (SARADC) comprising:
an analog input having an analog input voltage;
a Successive-Approximation-Register (SAR) having a digital value that is successively adjusted to converge to closer approximations of the analog input voltage;
a digital-to-analog converter (DAC), receiving a reference voltage and the digital value from the SAR, the DAC generating a converted analog voltage represented by the digital value;
a series of stages including a first stage and a final stage, the first stage receiving the converted analog voltage and the analog input voltage as stage inputs, the final stage outputting compare results as stage outputs, wherein each intermediate stage in the series of stages has stage inputs coupled to stage outputs of a prior stage and stage outputs connected to stage inputs of a following stage;
wherein the stage outputs comprise an inverting output and a non-inverting output;
wherein the SAR adjusts the digital value based on the compare results;
wherein each stage in the series of stages comprises:
a first input switch that connects a first one of the stage inputs to an inverting input in response to a second clock;
a second input switch that connects a second one of the stage inputs to a non-inverting input in response to the second clock;
a first current source generating a first current;
a first primary differential transistor, having a gate receiving the non-inverting input, that conducts a portion of the first current to the inverting output;
a second primary differential transistor, having a gate receiving an inverting input, that conducts a portion of the first current to the non-inverting output;
a second current source that generates a second current;
a first secondary differential transistor, having a gate receiving a non-inverting feedback input, that conducts a portion of the second current to the inverting output;
a second secondary differential transistor, having a gate receiving an inverting feedback input, that conducts a portion of the second current to the non-inverting output;
an inverting current sink transistor that conducts a first sink current from the inverting output in response to a first sink gate;
a non-inverting current sink transistor that conducts a second sink current from the non-inverting output in response to a second sink gate;
a first feedback switch that connects the non-inverting feedback input to the non-inverting output in response to a first clock;
a second feedback switch that connects the inverting feedback input to the inverting output in response to the first clock; and
an offset capacitor that stores an offset charge between the inverting feedback input and the non-inverting feedback input.

21. The Successive-Approximation-Register Analog-to-Digital Converter (SARADC) of claim 20 wherein the first primary differential transistor, the second primary differential transistor, the first secondary differential transistor, and the second secondary differential transistor comprise p-channel transistors;
wherein the inverting current sink transistor and the non-inverting current sink transistor comprise n-channel transistors.

22. The Successive-Approximation-Register Analog-to-Digital Converter (SARADC) of claim 21 wherein the first input switch, the second input switch, the first feedback switch, and the second feedback switch are p-channel transistors, or n-channel transistors, or transmission gates having both a p-channel transistor and an n-channel transistor in parallel.

23. The Successive-Approximation-Register Analog-to-Digital Converter (SARADC) of claim 22 further comprising:
a first variable bias for applying a first bias voltage to the first sink gate when a first clock is active, and for applying a second bias voltage to the first sink gate when a second clock is active;
a second variable bias for applying a first bias voltage to the second sink gate when the first clock is active, and for applying a second bias voltage to the second sink gate when the second clock is active.

* * * * *